(12) United States Patent
Tseng et al.

(10) Patent No.: US 6,485,605 B1
(45) Date of Patent: Nov. 26, 2002

(54) HIGH TEMPERATURE PROCESS CHAMBER HAVING IMPROVED HEAT ENDURANCE

(75) Inventors: Huan-Liang Tseng, Hsing Chu (TW); Hsyun-Ying Chan, Hsin Chu (TW); Ping-Jen Cheng, Chung Li (TW)

(73) Assignee: Taiwan SEmiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/553,303

(22) Filed: Apr. 20, 2000

(51) Int. Cl.$^7$ ............................................. C23C 16/00
(52) U.S. Cl. ........................... 156/345.54; 156/345.48; 118/724; 118/723 I; 118/729
(58) Field of Search ............... 156/345, 345.54, 156/345.48; 118/724, 729, 723 E, 723 I

(56) References Cited

U.S. PATENT DOCUMENTS

| | | | |
|---|---|---|---|
| 4,431,473 A | * 2/1984 | Okano | 156/345 |
| 4,838,978 A | * 6/1989 | Sekine | 156/345 |
| 5,148,714 A | * 9/1992 | McDiarmid | 118/730 |
| 5,704,984 A | * 1/1998 | Lee | 118/724 |
| 5,846,332 A | * 12/1998 | Zhao | 118/723 E |
| 6,235,146 B1 | * 5/2001 | Kadotani | 156/345 |

* cited by examiner

Primary Examiner—Richard Bueker
(74) Attorney, Agent, or Firm—Tung & Associates

(57) ABSTRACT

A high temperature process chamber that has improved heat endurance and a method for improving heat endurance of a process chamber are described. In the high temperature process chamber, a heat insulating adapter is connected in-between a lift cylinder and a chamber body in which a plasma ashing process is conducted at 250° C. The heat insulating adapter prevents substantially heat conduction from the chamber body to the lift cylinder such that the cylinder can be safely operated at a temperature lower than 40° C. The present invention method for improving heat endurance of a process chamber can be carried out by connecting a heat insulating adapter between a wafer pedestal and a lift cylinder, conducting a process at a temperature of at least 200° C., and preferably at least 250° C. in the process chamber while maintaining a temperature of the lift cylinder at below 40° C.

11 Claims, 2 Drawing Sheets

HIGH TEMPERATURE PROCESS CHAMBER HAVING IMPROVED HEAT ENDURANCE

FIELD OF THE INVENTION

The present invention generally relates to a high temperature process chamber and a method for using the chamber and more particularly, relates to a high temperature process chamber that has improved heat endurance and a method for improving the heat endurance a process chamber.

BACKGROUND OF THE INVENTION

In the fabrication of semiconductor devices, dry chemical etching occurs when a chemical reaction takes place between a gas and a wafer surface, with or without a plasma, while the resulting volatile product is pumped away. The dry etching process is typically selective and non-directional. In a plasma-assisted chemical etching process, the major role of the plasma is to maintain a supply of reactive species in the form of free radicals and excited neutrals.

In plasma-assisted chemical etching, material is selectively removed by a reactive gas created near or within a glow discharge from an initially non-reactive gas mixture. In most plasma etching systems, the injected gas itself rarely reacts with the surface that has been etched while free radicals are believed to be the major reactant species. The gas mixture is selected to produce reactive species by molecular dissociation into radicals and excitation of neutrals in the plasma. Because of the absence of physical enhancement or ion bombardment, plasma-assisted chemical etching is essentially isotropic and very selective. The plasma assisted chemical etching is therefore widely used when isotropic etching is required or when dimensional control is not critical. The most common example of plasma assisted chemical etching is the removal of a photoresist layer in an oxygen plasma, sometimes referred to as a plasma ashing technique.

The plasma ashing technique is an isotropic etch process of an organic photoresist material in an oxygen glow discharge where atomic oxygen is produced together with electrons. The oxygen atoms then react with the organic material to form the volatile products of CO, $CO_2$ and $H_2O$. It has been found that since most of the underlying film materials are not attacked by an oxygen plasma, over etching is frequently used to ensure that all resist materials are removed without residues. For instance, a wafer that is coated with 1 $\mu$m photoresist material can be processed between 5 and 10 minutes. The plasma ashing process can also be used for descumming of wafers, i.e. removal of residual layers of photoresist or other organic material following a resist developing and hard baking processes. Typically, the residues can be removed in a 1 minute exposure to an oxygen plasma.

The plasma ashing process reduces costs and potential hazards of a wet chemical etching. It has therefore become an important etching step to remove photoresist materials, particularly those which have become insoluble in wet solvents. For instance, when the photoresist material has been exposed to a flourine or a chlorine dry etch environment during a polysilicon or oxide etching or to high current ion implantation. After a hardened top layer of the photoresist has been removed, a plasma etching or wet chemical etching process can be used to remove the remainder of the photoresist material. A plasma ashing process can also be followed by a cleaning step to remove ions and heavy metals which are not volatilized by the oxygen plasma process.

A typical inductively coupled plasma etch chamber 10 is shown in FIG. 1. In the etch chamber 10, the plasma source is a transformer coupled plasma source which generates a high density, low pressure plasma 12 decoupled from the wafer 14. The plasma source allows an independent control of ion flux and ion energy. Plasma 12 is generated by a flat spiral coil, 16, i.e. an inductive coil separated from the plasma by a dielectric plate 18, or a dielectric window on top of the reactor chamber 20. The wafer 14 is positioned sufficiently away from the coil 16 so that it is not affected by the electromagnetic field generated by the coil 16. There is very little plasma density loss since plasma 12 is generated only a few mean-free-path away from the wafer surface. The plasma etcher 10 enables a high density plasma an high etch rates to be achieved. In the etcher 10, and inductive supply 22 and a bias supply 24 are used to generate the necessary plasma field. Multi-pole magnets 26 are used for surrounding plasma 12 generated. A wafer chuck 28 which moves up-and-down by shaft 32 is used to hold wafer 14 during the etching process. A ground 30 is provided to one end of the inductive coil 16.

In a typical inductively coupled RF plasma etcher 10, a source frequency of 13.5 MHZ and a substrate bias frequency of 13.5 MHZ are utilized. An ion density of approximately $0.5 \sim 2.0 \times 10^{12}/m^3$, an electron temperature of 3.5~6.0 eV, and a chamber pressure of 1~25 mTorr are used.

In the plasma ashing chamber 10 of FIG. 1, the wafer stage 28 operates at a typical high temperature of about 250° C. in a photoresist stripping process. A lift cylinder 34 is installed under the support 36, as shown in FIGS. 2A, 2B, 3A and 3B. The support 36 is fastened to a bottom chamber wall 38, as shown in FIG. 3B by a plurality of screws 40. The lift cylinder 34 is operated by compressed airfed through an inlet needle valve 42 and an outlet needle valve 44. The shaft 32 is further supported and guided by a support cylinder 46. An upper support cylinder 48, as shown in FIG. 3A, is used to support and guide the shaft 32 located inside the plasma process chamber when the support 36 is fastened to the bottom chamber wall 38 of the plasma process chamber 10.

In the conventional plasma ashing chamber 10, the lift cylinder 34 which is operated by the needle valves 42,44 is mounted directly to the support 36 in close proximity of the plasma process chamber 10, i.e. by mounting directly to the bottom process chamber wall 38. Since the wafer stage 28 in the plasma process chamber 10 is kept at 250° C. during a photoresist stripping process, the lift cylinder 34 operates at a temperature of about 70° C. from the heat conduction through the support 36 and the support cylinder 46. Commercially available lift cylinders are not designed to operate at such high temperature and furthermore, are not equipped with anti-friction O-ring to function properly on a long term basis. The control elements, such as the needle valves 42,44 are also likely to fail when exposed to such high operating temperature. It has been found that there is a 65% failure rate of the lift cylinder during a four year running period on a plasma process chamber.

Numerous equipment problems have therefore been encountered in the conventional plasma process chamber 10. These include a loss of accurate speed control of the wafer stage 28 by the lift cylinder 34 due to failure in the needle valves 42,44. When the needle valves 42,44 are worn after extended exposure to high operating temperature, the control of compressed air flow through the needle valves 42,44 is no longer accurate and frequently results in too fast a speed in the upward movement of the wafer stage 28. Furthermore, after a failure in the lift cylinder 34 has occurred, the plasma process chamber must be opened in order to change the lift cylinder. During a preventive maintenance procedure, the temperature of the plasma process chamber must also be dropped to room temperature in order to carry out the procedure. When the operation of the chamber is resumed, the O-ring on the left cylinder does not seal properly since the seal has not expanded to its supposed volume at 70° C. resulting in leaks through the seal. The conventional lift cylinder can only function properly for about six months which is impossible in maintaining a high throughput in the fabrication process.

It is therefore an object of the present invention to provide a high temperature process chamber that does not have the drawbacks or shortcomings of the conventional high temperature process chambers.

It is another object of the present invention to provide a high temperature process chamber that has improved heat endurance by insulating components of the chamber from the high temperature environment in the chamber.

It is a further object of the present invention to provide a high temperature process chamber that has improved heat endurance when the process chamber operates at a temperature of at least 200° C.

It is another further object of the present invention to provide a high temperature process chamber that has improved heat endurance by connecting a heat insulating adapter between the chamber body and a lift cylinder used for lifting a wafer stage.

It is still another object of the present invention to provide a high temperature process chamber that has improved heat endurance by insulating a lift cylinder from the chamber such that the cylinder operates at a temperature below 40° C.

It is yet another object of the present invention to provide a reactive ion etch chamber that is equipped with a wafer pedestal wherein a heat insulating adapter is used between the chamber body and a lift cylinder for preventing overheating of the lift cylinder.

It is still another further object of the present invention to provide a reactive ion etching chamber that is equipped with a wafer pedestal that operates at a temperature of at least 200° C. by insulating a lift cylinder from the chamber such that the cylinder operates at a temperature not higher than 40° C.

It is yet another further object of the present invention to provide a method for improving heat endurance of a process chamber by connecting a heat insulating adapter between a wafer pedestal that operating at 250° C. and a lift cylinder that operates at a temperature below 40° C. to avoid damaging the lift cylinder.

SUMMARY OF THE INVENTION

In accordance with the present invention, a high temperature process chamber that has improved heat endurance and a method for improving heat endurance of a process chamber are provided.

In a preferred embodiment, a high temperature process chamber that has improved heat endurance is provided which includes a chamber body equipped with a wafer pedestal for holding a wafer thereon and for processing the wafer at a temperature of at least 200° C., a lift cylinder position below and outside the chamber body for operating the wafer pedestal in an up-and-down motion, the cylinder further includes components that are operable at temperatures lower than 40° C., and an adapter means situated in between the wafer pedestal and the lift cylinder formed at least partially of a heat insulating material such that the high temperature of the wafer pedestal is substantially attenuated from the lift cylinder to allow the lift cylinder to operate at a temperature below 40° C.

In the high temperature process chamber that has improved heat endurance, the lift cylinder is operated by pressurized air that is controlled by an input needle valve and an output needle valve. The high temperature process chamber is a reactive ion etch chamber, or a reactive ion etch chamber for stripping a photoresist layer, or a reactive ion etch chamber for stripping a photoresist layer operated at a temperature of about 250° C. The adapter means may further include heat dissipating means, or heat dissipating means of a metal disc that has apertures therethrough. The adapter means may further include an insulator plate formed of a heat insulating material mounted to a bottom end of the adapter means for direct contact with the lift cylinder. The adapter means may further include an apertured collar, an apertured shaft and a locking pin for separating the adapter means into an upper portion and a lower portion, the upper portion is bolted to the chamber body and the lower portion is bolted to the lift cylinder. The adapter means is substantially fabricated of stainless steel. The lift cylinder may be substantially attenuated from the wafer pedestal to allow the cylinder to operate at a temperature below 40° C.

The present invention is further directed to a reactive ion etch chamber that is equipped with a wafer pedestal which includes a chamber enclosure for conducting etching on a wafer positioned on a wafer pedestal at a temperature of at least 200° C., a lift cylinder for elevating/lowering the wafer pedestal, the lift cylinder may be positioned outside the chamber enclosure, and a heat insulating adapter for connecting to the chamber enclosure at an upper end and to the lift cylinder at a lower end such that the lift cylinder operates at a temperature not higher than 40° C.

In the reactive ion etching chamber that is equipped with a wafer pedestal, the lift cylinder consists of an upper portion and a lower portion connected by a quick disconnect means. The adapter may further include at least one apertured heat dissipating disc and at least one insulator plate made of a heat insulating material.

The present invention is further directed to a method for improving heat endurance of a process chamber which can be carried out by the operating steps of providing a process chamber that is equipped with a wafer pedestal therein, providing a lift cylinder situated outside of the process chamber for elevating/lowering the wafer pedestal, connecting a heat insulating adapter between the wafer pedestal and the lift cylinder, and conducting a process at a temperature of at least 200° C. in the process chamber while maintaining a temperature of the lift cylinder at below 40° C.

The method for improving heat endurance of a process chamber may further include the step of providing the process chamber in a reactive ion etch chamber. The method may further include the step of providing the heat insulating adapter equipped with at least one heat dissipating disc and at least one heat insulating plate. The method may further include the step of connecting the heat insulating adapter to the wafer pedestal in the lift cylinder by bolts. The method may further include the step of conducting a reactive ion etching process on a photoresist layer at a temperature of at least 230° C., or the step of maintaining a temperature of the lift cylinder at below 40° C.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a high temperature process chamber that has improved heat endurance and a method for improving the heat endurance of a process chamber. While the present invention novel chamber and method can be used in any type of semiconductor processes, the chamber and the method are particularly suitable for use on a plasma assisted etch chamber of the reactive ion etch type.

In the process chamber which includes a wafer pedestal for holding a wafer thereon and for processing the wafer at a temperature of at least 200° C., i.e. at a temperature of 250° C., for instance, in a photoresist stripping process, a lift cylinder which is necessary for positioning the wafer pedestal inside the chamber is mounted outside the chamber wall with a heat insulating adapter positioned thereinbetween. The heat insulating adapter provides two valuable functions. First, to provide hat insulation between the high process temperature of 250° C. in the plasma etch chamber and the low temperature of below 40° C. of the lift cylinder. Secondly, the heat insulating adapter provides the valuable function of quick disconnect such that the lift cylinder, when replacement or preventive maintenance is required, can be readily disconnected from the plasma process chamber and be serviced. The quick replacement feature significantly reduces down time required for the plasma process chamber and thus ensuring the high yield of the process.

The heat insulating adapter can be fabricated with at least partially a heat insulating material such as a heat insulator plate for attenuating heat conduction from the plasma process chamber to the lift cylinder. The heat insulator adapter may further include at least one heat dissipating disc, i.e. a metal disc, that contains numerous apertures to facilitate heat dissipation into the ambient air. The heat dissipating disc should be fabricated in a material that has high heat conductivity, such as a metallic material.

The invention is further directed to a method for improving heat endurance of a process chamber by inserting a heat insulating adapter between a wafer pedestal, in a plasma process chamber and a lift cylinder that is positioned outside the chamber. The method further includes the step of providing the heat insulating adapter with at least one insulator plate fabricated of a heat insulating material and at least one heat dissipating disc, preferably with apertures therein. The method is capable of improving heat endurance of a process chamber by significantly reducing the amount of heat conductance between the plasma process chamber and the lift cylinder such that the lift cylinder can be safely operated at a temperature below 40° C., even when the process temperature in the plasma chamber is at least 200° C., or at least 250° C.

Figure 1:
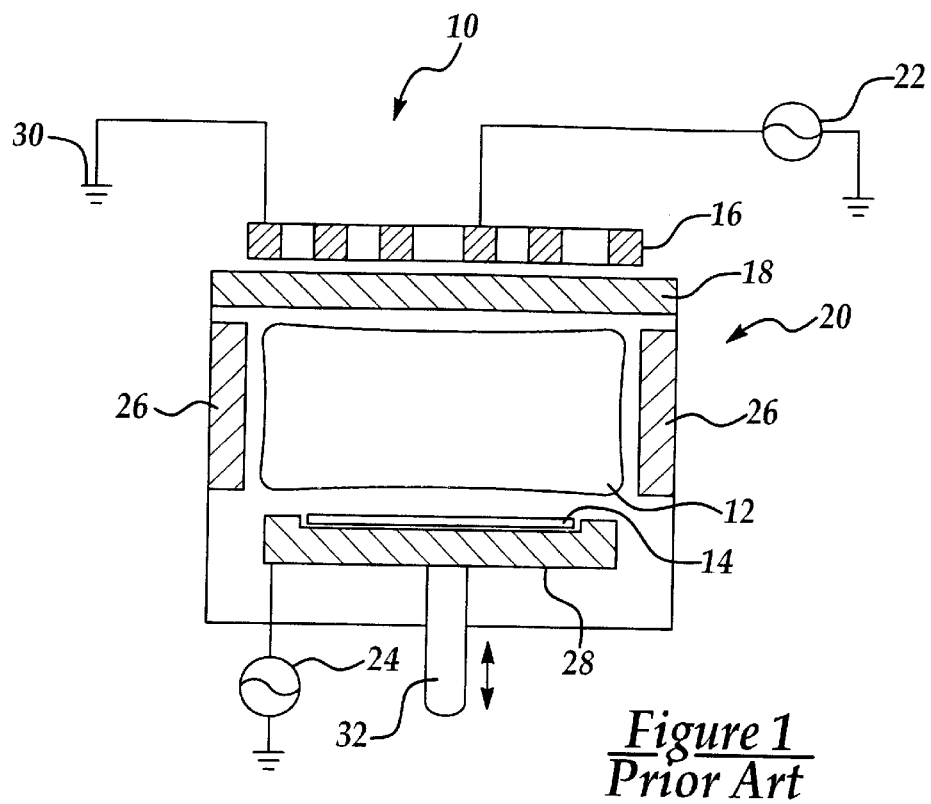
FIG. 1 is a cross-sectional view of a conventional plasma assisted etch chamber equipped with a wafer pedestal for elevating/lowering a wafer.
Figure 2A:
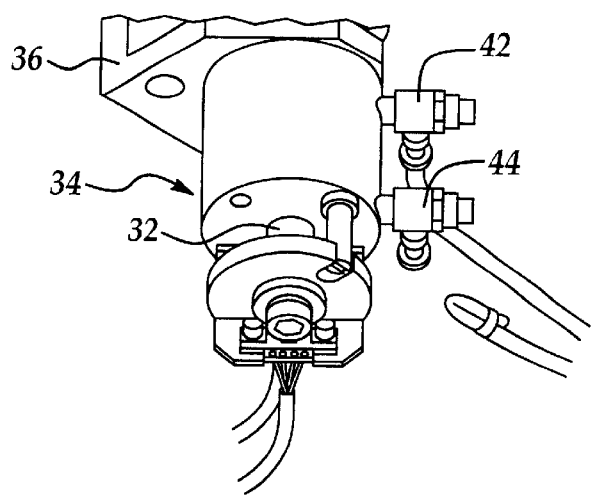
FIG. 2A is a perspective view of a conventional lift cylinder mounted directly on a support for a plasma etch chamber.
Figure 2B:
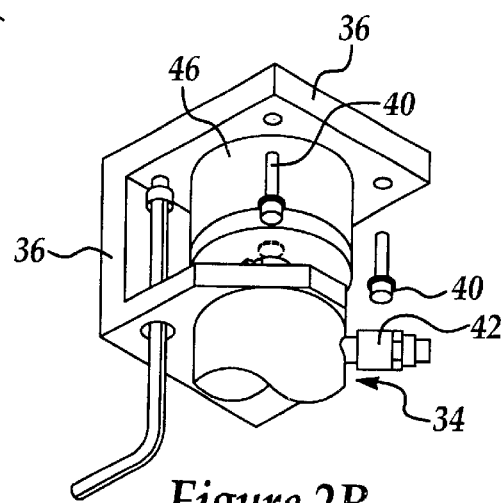
FIG. 2B is a perspective view showing a support member for a plasma etch chamber.
Figure 3A:
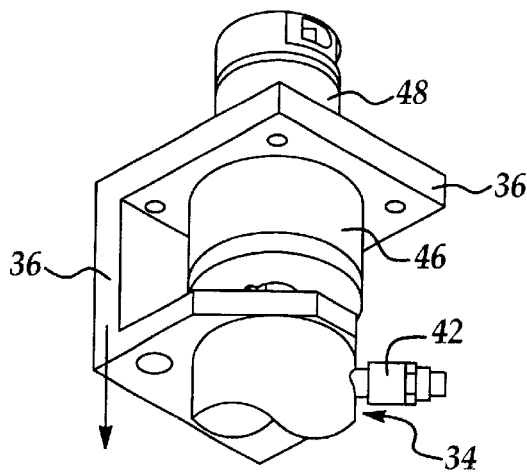
FIG. 3A is a perspective view of a support member equipped with support cylinders for elevating/lowering a wafer pedestal in a plasma etch chamber.
Figure 3B:
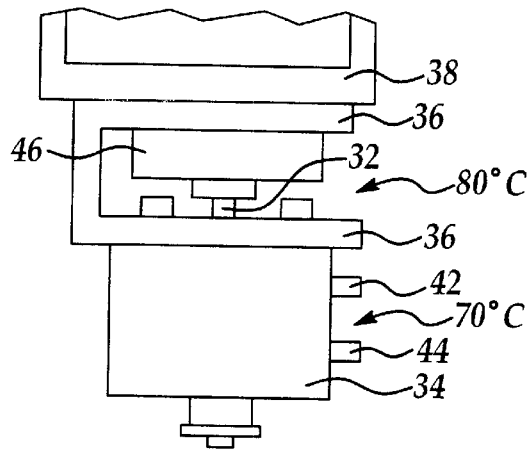
FIG. 3B is a cross-sectional view of the conventional lift cylinder mechanism for a plasma process chamber.
Figure 4:
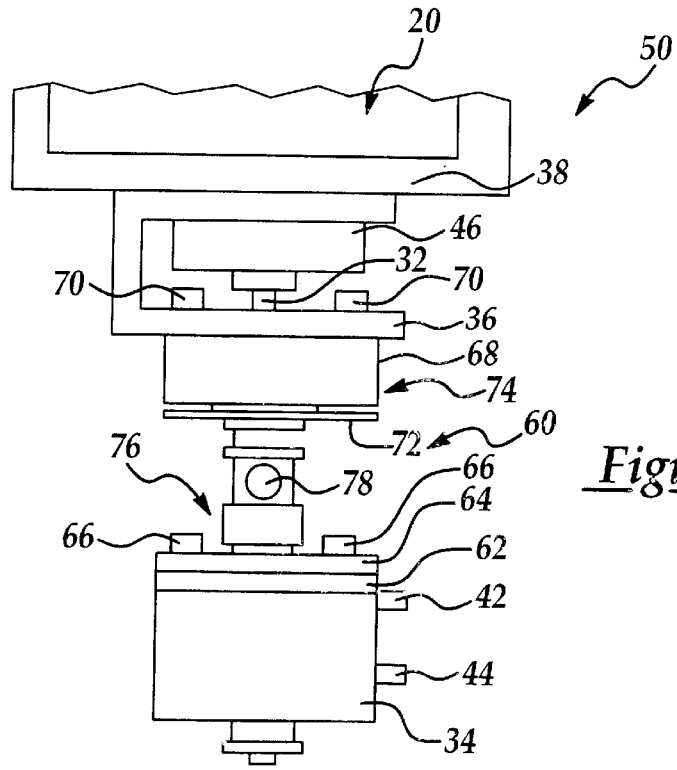
FIG. 4 is a cross-sectional view illustrating the present invention lift cylinder mounted to a plasma process chamber by connecting a heat insulating adapter thereinbetween.

A cross-sectional view of the present invention apparatus 50 is shown in FIG. 4. The apparatus 50 is constructed by a chamber support 36, a lift cylinder 34 and an adapter 60 connected thereinbetween. The adapter 60, the heat insulating adapter, is constructed at least partially by a heat insulating material, for instance, the adapter 60 include an insulator plate 62 mounted at an interface between the adapter 60 and the lift cylinder 34. The insulator plate 62 can be fabricated of a heat insulating material and preferably, a rigid type heat insulating material of polymeric nature. The base plate 64 of the adapter 60 is fastened to the lift cylinder 34 by bolts 66 through the insulator plate 62. The upper mounting plate 68 of the adapter 60 is mechanically connected to the support 36 for the plasma process chamber 20 by bolts 70. The plasma process chamber 20 sits on top of the chamber support 36 when a plasma etching process is conducted therein at 250° C.

The adapter 60 is further constructed by stainless steel for its high rigidity and inertness to chemicals used in semiconductor processing. At least one heat dissipating disc 72 is utilized which is in intimate contact with the adapter 60. The heat dissipating disc can be advantageously fabricated with a plurality of apertures (not shown) therein to facilitate heat dissipation into the ambient air. It should be noted that while only one heat dissipating disc 72 is shown in FIG. 4, more heat dissipating discs may be utilized if a higher heat dissipating efficiency is desired.

The adapter 60 is constructed in such a way that it can be readily separated into two parts, i.e. an upper portion 74 and a lower portion 76. As shown in FIG. 4, the upper end of the lower portion 76 is formed in an apertured collar for connecting to an apertured shaft (not shown) of the upper portion 74 by a lock pin 78. This arrangement allows quick disconnect and connect of the lower portion 76 and to the upper portion 74. In other words, allows the quick disconnect of the lift cylinder 34 when repair or replacement of the lift cylinder is desired. The present invention novel apparatus and method therefore allows a significant time saving when the replacement of lift cylinder is necessary and thus, preserving a high throughput without sacrificing production time in the plasma etch chamber.

As shown in FIG. 4, when a plasma etch process, or a plasma ashing process is conducted at about 250° C. in the plasma chamber 20, the support 36 which is physically connected to the bottom process chamber wall 38 reaches a temperature of about 80° C. With significantly reduced heat conduction through the adapter 60, which is maintained at a temperature between 50° C. and 70° C., the lift cylinder can be operated at a low temperature of about 37° C. The lifetime of the lift cylinder, or the lifetime of the needle valves, 42,44 can therefore be substantially extended without the premature failure problem observed in conventional lift cylinders used in high temperature process chambers.

The present invention novel high temperature process chamber that has improved heat endurance and a method for improving heat endurance of a process chamber have therefore been amply described in the above description and in the appended drawing of FIG. 4.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A high temperature process chamber having improved heat endurance comprising:

a chamber body equipped with a wafer pedestal for holding a wafer thereon and for processing the wafer at a temperature of at least 200° C.;

a lift cylinder positioned below and outside said chamber body for operating said wafer pedestal in an up-and-down motion, said cylinder further comprises components that are operable at temperatures below than 40° C.; and an adapter means situated between said wafer pedestal and said lift cylinder formed at least partially of a heat insulating material such that said high temperature of said wafer pedestal is substantially attenuated from said lift cylinder to allow the cylinder to operate at a temperature below 40° C., said adapter means further comprises an apertured collar, an apertured shaft and a locking pin for separating said adapter means into an upper portion and a lower portion, said upper portion being bolted to said chamber body and said lower portion being bolted to said lift cylinder.

2. A high temperature process chamber having improved heat endurance according to claim 1, wherein said lift cylinder being operated by compressed air controlled by an input needle value and an output needle value.

3. A high temperature process chamber having improved heat endurance according to claim 1, wherein said high temperature process chamber is a reactive ion etch (RIE) chamber.

4. A high temperature process chamber having improved heat endurance according to claim 1, wherein said high temperature process chamber is a reactive ion etch (RIE) chamber for stripping a photoresist layer.

5. A high temperature process chamber having improved heat endurance according to claim 1, wherein said high temperature process chamber is a reactive ion etch (RIE) chamber for stripping a photoresist layer operated at a temperature of about 250° C.

6. A high temperature process chamber having improved heat endurance according to claim 1, wherein said adapter means further comprises heat dissipating means.

7. A high temperature process chamber having improved heat endurance according to claim 1, wherein said adapter means further comprises heat dissipating means of a metal disc having apertures therethrough.

8. A high temperature process chamber having improved heat endurance according to claim 1, wherein said adapter means further comprises an insulator plate formed of a heat insulating material mounted to a bottom end of said adapter means for direct contact with said lift cylinder.

9. A high temperature process chamber having improved heat endurance according to claim 1, wherein said adapter means being substantially made of stainless steel.

10. A reactive ion etching (RIE) chamber equipped with a wafer pedestal comprising:

a chamber enclosure for conducting etching on a wafer positioned on a wafer pedestal at a temperature of at least 200° C.;

a lift cylinder for elevating/lowering said wafer pedestal, said lift cylinder being positioned outside said chamber enclosure; and a heat insulating adapter comprises an apertured collar, an apertured shaft and a locking pin for separating said adapter into an upper portion and a lower portion, said upper portion being connected to said chamber enclosure and said lower portion being connected to said lift cylinder such that said lift cylinder operates at a temperature not higher than 40° C.

11. A reactive ion etching (RIE) chamber equipped with a wafer pedestal according to claim 10, wherein said heat insulating adapter consists of an upper portion and a lower portion connected by a quick disconnect means.

* * * * *